(12) United States Patent
Jou et al.

(10) Patent No.: US 6,265,892 B1
(45) Date of Patent: Jul. 24, 2001

(54) LOW NOISE OUTPUT BUFFER

(75) Inventors: Shyh-Jye Jou, Taoyuan Hsien; Ray-De Chiao, Taipei; Shu-Hua Kuo, Kaohsiung; Tin-Hao Lin, Hsinchu, all of (TW)

(73) Assignee: Faraday Technology Corp., Hsinchu (TW)

( * ) Notice: Subject to any disclaimer, the term of this patent is extended or adjusted under 35 U.S.C. 154(b) by 0 days.

(21) Appl. No.: 09/371,199

(22) Filed: Aug. 10, 1999

(51) Int. Cl.[7] .......................... H03K 17/16; H03K 17/003
(52) U.S. Cl. ................. 326/27; 326/26; 326/87
(58) Field of Search .................. 326/27, 83, 86, 326/87, 57, 58, 26

(56) References Cited

U.S. PATENT DOCUMENTS

| 4,983,860 | * | 1/1991 | Yim et al. ............................ 326/86 |
| 5,063,308 | * | 11/1991 | Borkar ................................... 326/27 |
| 5,122,690 | * | 6/1992 | Bianchi .................................. 326/87 |
| 6,124,733 | * | 9/2000 | Sharpe-Geisler ..................... 326/83 |

* cited by examiner

Primary Examiner—Michael Tokar
Assistant Examiner—Steven S. Paik
(74) Attorney, Agent, or Firm—Jiawei Huang; J.C. Patents

(57) ABSTRACT

A low noise output buffer to simultaneously reduce switching noise and output signal ringing for output ringing and maintain DC current. A temporary and a steady-state output buffers are supplied by a buffer voltage source and an internal circuit voltage source, respectively. Each driver has a pull-up and a pull-down transistors. While switching the output buffer from a high voltage level to a low voltage level or from a low voltage level to a high voltage level, a predriver and a single steady-state circuit are designed to respectively generate a large simultaneous switching noise at the buffer voltage source and a small simultaneous switching noise at the internal circuit voltage source. A Schmitt trigger circuit is also used to turn off the temporary driver, so as to reduce the output signal ringing while the steady-state driver maintains a supply of DC current. In another design of a low noise output buffer to reduce ground bounces and output signal ringing as well as to maintain a DC current, a temporary driver is used. An adaptive characteristic of the low noise output buffer under different loading conditions is achieved by a feedback circuit. The temporary driver is turned on only during the middle period of output transition time to provide an additional charging or discharging current. Since the temporary driver is always off apart from the transition period, the effect of reducing ground bounces and output signal ringing can thus be outstanding.

32 Claims, 10 Drawing Sheets

LOW NOISE OUTPUT BUFFER

BACKGROUND OF THE INVENTION

1. Field of the Invention

The invention relates in general to an output buffer. More particularly, this invention relates a low noise output buffer which can simultaneously reduce switching noise and output signal ringing and maintain a DC current supply, or even with the function of reducing ground bounces.

2. Description of the Related Art

In a high operating speed digital circuit, the simultaneous switching noise (SSN) is the main source of noise. The output pad driver is the major contributor to simultaneous switching noise because of large transient currents flowing through the bounding wires, leadframe, and pin parasitic inductance. FIG. 1 shows a schematic diagram of a parasitic inductance induced after chip-package. A driver 70 having a voltage source connected to pins via pads and bonding wires induces a pin parasitic inductance 10 and a pad/bonding wire parasitic inductance 20. Similarly, at ground terminal Gnd and Load terminal $C_L$, pin parasitic inductance 50, 30 and pad/bonding wire parasitic inductance 60, 40 are induced.

The simultaneous switching noise has the following outward effects:

(1) The maximum bouncing voltage of simultaneous switching noise between voltage source and the ground terminal ($V_{DD}$/Gnd (SSN)) increases when the number of simultaneous switching output is increased. As the increase of the bouncing voltage, the time for output voltage to achieve a steady state is delayed. Consequently, the speed of the digital circuit is affected. Referring to both FIG. 2a and FIG. 2b, to the statistic analysis data, the delay time is increased when the number of switching outputs is increased. In addition, the SSN is increased as the increase of the number of the switching output. This indicates that the delay time increases when the slew rate of current increases, so as the SSN. It is known that to obtain a high speed performance, a MOS transistor of an output buffer is designed with a larger channel width to improve the capability of driving current. However, an enhanced driving current capacity induces a larger SSN and a longer delay time. It is very likely to cause a deteriorated performance or wrong function.

(2) FIG. 3 illustrates a schematic diagram of interference caused by SSN. Assuming that an active driver 90 and a quiet driver 100 have a common of $V_{DD}$/Gnd, because the $V_{DD}$/Gnd line are disturbed by SSN of the active driver 90, the quiet driver is disturbed through the $V_{DD}$/Gnd line. When a high level H is supplied to the quiet driver 100 from an internal circuit 80, the output thereof is fixed at a low level L. Meanwhile, a signal of transferring from L to H is transmitted to n active drivers 90, so that one signal of transferring from H to L is generated by each of the n active drivers 90. n discharging currents thus flow to the internal ground terminal 95 at the same time. Since a parasitic inductance exists between the internal ground terminal 90 and an external Gnd, a spike noise is generated between internal ground terminal 95 and the external Gnd by n discharging currents (n×$i_{discharge}$). Thus, the quiet driver 100 with an output at L is still disturbed by the spike noise through the internal ground terminal. It is possible that a receiver 110 may receive the spike noise as the signal to perform a wrong function.

FIG. 4 shows a conventional output buffer made in order to reduce SSN. The output buffer 160 includes a quiet driver 120 coupled to a quiet $V_{DD}$/quiet GND (quiet $V_{DD}$/GND) voltage source and a noise driver 130 coupled to a noise $V_{DD}$/noise GND (noisy $V_{DD}$/GND) voltage source. The quiet driver 120 further includes a quiet pull-up transistor 122, a quiet pull-down transistor 124, and a predriver composed of a first NOR gate 141 and a second NOR gate 142. The noise driver 130 includes a noise pull-up transistor 132, a noise pull-down transistor 134, and a predriver composed of a third NOR gate 143 and a fourth NOR gate 144. A first feedback NOT gate 150 and a second feedback NOT gate 152 are used to feed back a signal of an output terminal.

Under a steady state, when an input terminal 112 is H, an output terminal 114 is H, the first NOR gate 141 has L and L inputs and an H output, the quiet pull-up transistor 122 is turned on to provide H to the output terminals 114. The second NOR gate 142 has H and H inputs and an L output, the quiet pull-down transistor 124 is turned off. The third NOR gate 143 has an L input, an H input and an L output. The noise pull-up transistor 132 is turned off. The fourth NOR gate 144 has an L input, an H input and an L input. The noise pull-down transistor 132 is turned off. Meanwhile, only the quiet pull-up transistor 122 of the quiet driver 120 provides H to the output terminal.

When the input terminal enters is switched from H to L, two steps are included:

(1) Before the H state of the output terminal changes, since the input terminal 112 has been converted into L, the first NOR gate 141 has H and L inputs and L output, and the quiet pull-up transistor 122 is turned off. The inputs of the second NOR gate 142 are H and L and the output thereof is L, the quiet pull-down transistor 124 is turned off. The inputs of the third NOR gate 143 are H and H and the output thereof is L, the noise pull-up transistor 132 is turned off. The fourth NOR gate 144 has L and L inputs and H output, the noise pull-down transistor 134 is turned on to provide L to the output terminal 114. That is, a forepart of state transferring is to turn on the noise pull-down transistor 132 by the noise driver 130, so as to provide L to the output terminal 114. Meanwhile, SSN is generated in the noise GND voltage source.

(2) When the output terminal 114 is switched to L by the noise pull-down transistor 134 and fed back to the first and the second feedback NOT gates 150 and 152, the first NOR gate 141 has H and H inputs and L output, the quiet pull-up transistor 122 is thus turned off. The second NOR gate 142 has L and L inputs and an H output, so that the quiet pull-down transistor 124 is turned on to provide L to the output terminal 114. The inputs of the third NOR gate 143 are H and L and the output thereof is L, the noise pull-up transistor 132 is turned off. For the fourth NOR gate 144, the inputs are H and L and the output is H, the noise pull-down transistor 132 is turned off. That is, when the state is switched to a steady state, the quiet pull-down transistor 124 of the quiet driver 120 is turned on to provide L to the output terminal 114. Thus, SSN at the quiet GND voltage source is greatly reduced without affecting the internal circuit.

Similarly, when the input terminal 112 is switched from L to H before the output terminal 114 is converted to H, the quiet driver 120 is turned off. The noise driver 130 is turned on to bear with a large SSN at the noise $V_{DD}$/noise GND voltage source. When the output terminal 114 is switched to H, the noise driver 130 is turned off, the quiet driver 120 is turned on, a smaller SSN at the quiet $V_{DD}$/quiet GND voltage source is resulted.

The conventional output buffer has the following drawbacks:

(1) The output buffer uses two independent voltage sources for operation. The forepart of state transferring for the output terminal uses one voltage source, while the latter part of the state transferring uses another voltage source.

(2) When the output terminal 114 is switched from H to L, or from L to H, with regard to the first feedback NOT gate 150, a trigger level to turn off the noise driver 130 is the same as that to turn on the quiet driver 120. As a consequence, the speed of outputting signal is reduced.

(3) When the noise driver 130 is off and the quiet driver 120 are on, the slew rate to turn on the quiet pull-up or pull down transistor of the quiet driver 120 can not be too slow. However, with a very fast slew rate, SSN is increased. For the buffer 160, the SSN at quiet $V_{DD}$/quiet GND is still too large.

Many attempts of fabricating an output buffer with reduced ground bounces have also been made. In U.S. Pat. No. 5,708,386 published in Jan. 13, 1998, a "CMOS output buffer with reduced L-DI/DT noise" was disclosed to achieve the objective. The patent discloses a driver circuit in which two delays are used and both turned on during a transient time to limit the time for driving an output terminal, so as to reduce the noise generation. Thus, both the delay and the transient time are fixed. Since the delay is a function of the load that the current is driving, proper operation depends on some extent of the load as known. Therefore, this type of buffer varies with different loading condition. The fixed delays thus can not work properly to reduce the noise of power line for an unknown loading.

SUMMARY OF THE INVENTION

The invention provides a low noise output buffer which adapts only one independent voltage source accompanied with an internal circuit voltage source to substitute an additional independent voltage source used in the conventional output buffer. Therefore, the consumption in voltage sources can be saved.

In the low noise output buffer, a Schmitt circuit is used to provide two trigger levels to respectively turn off the pull-up transistor and the pull-down transistor, so as to enhance the operation speed of the output buffer.

In addition, with the design of a predriver and a single steady-state circuit, the SSN generated by an internal circuit voltage source is less than the SSN generated at the quiet $V_{DD}$/quiet GND by the conventional output buffer.

In one embodiment of the invention, a low noise output buffer is provided. The low noise output buffer comprises a data input terminal, a data output terminal, a predriver, a steady-state driver, a signal steady state means, and a temporary driver. The predriver includes a first NOT gate and a second NOT gate each having an input terminal coupled to the data input terminal. The steady-state driver includes a steady-state pull-up transistor and a steady-state pull-down transistor. The steady-state pull-up transistor has a source coupled to a first high voltage of an internal circuit voltage source, while a drain of the steady-state pull-up transistor is coupled to a drain of the steady-state pull down transistor. The drain of the steady-state pull-down transistor is further coupled to the data output terminal. The steady-state pull-down transistor further includes a source coupled to a first low voltage of the internal circuit voltage source. A gate of the steady-state pull-down transistor is coupled to an output terminal of the second NOT gate. The single steady-state means includes a Schmitt circuit, a NAND gate and a NOR gate. An input terminal of the Schmitt circuit is coupled to the data output terminal to feedback a signal of the data output terminal. Both the input terminals of the NAND gate and NOR gate are coupled to the data input terminal and an output of the Schmitt circuit. The temporary driver includes a temporary pull-up transistor and a temporary pull-down transistor. The temporary pull-up transistor has a source coupled to a second high voltage of a buffer voltage source and a drain coupled to a drain of the temporary pull-down transistor. A drain of the temporary pull-down transistor is coupled to the data output terminal. A source of the temporary pull-down transistor is coupled to a second low voltage of the buffer voltage source. A gate of the temporary pull-up transistor is coupled to an output terminal of the NAND gate, while a gate of the temporary pull-down transistor is coupled to an output terminal of the NOR gate.

In another embodiment of the invention, a low noise output buffer with a predriver coupled to a data input terminal for transferring and outputting a signal thereof transferred is provided. A steady-state driver operated by an internal circuit voltage source is coupled to the predriver to switch the signal thereof to a signal having a same state of the data input terminal. The switched signal is then fed into a data output terminal of the low noise output buffer. The single steady-state means comprises a normally high state output terminal and a normally low state output terminal coupled to both the data input and output terminals. According to signals of the data input and output terminals, a transient low level is generated at the normally high state output terminal or a transient high level is generated at the normally low state output terminal. A temporary driver uses a buffer voltage source to operate. The temporary driver is coupled to the normally high and low output terminals, and according thereto, the temporary driver is turned on or off.

Furthermore, the invention also provides a low noise output buffer in which gates of a temporary driver are not turned on/off simultaneously via various ways of connection. Thus, the short circuit current of a CMOS can be eliminated to reduce the SSN. A feedback circuit is used to change the turn-off time according to the change of loading, so that the performances of current driving and high speed operation can be realized.

The low noise output buffer comprises an input node, an output node, a first predriver, a steady-state driver, a delay unit, a feedback circuit, a second predriver and a temporary driver. The low noise output buffer is coupled to a first voltage source and a second voltage source. The predriver being supplied by the second voltage source is coupled to the input node to switch and output an input node signal. The steady-state driver is supplied by the first voltage source and coupled to the first predriver to switch a first predriver signal into a same state of the input node, and then to output first predriver signal. The delay unit is operated by the second voltage source. The delay unit is coupled to the input node to delay the input node signal. Being operated by the second voltage source, the feedback circuit is coupled to the output node to feed back a state of an output node signal. The second predriver is operated by the second voltage source and coupled to the feedback circuit and the delay unit. The steady-state driver is operated by the first voltage source, while the temporary driver is operated by the second voltage source. The temporary driver is coupled to the second predriver to be selectively turned or off according to an output of the second predriver.

In the above low noise output buffer, gates of the steady-state driver are respectively designed with various connection, so that the gates are not turned on or off simultaneously. The short-circuit current is thus eliminated, and the SSN is reduced.

The low noise output buffer uses a feedback circuit to alter the turn-off time according to a change of the load, so that the performance of driving current and high speed operation can be achieved.

Both the foregoing general description and the following detailed description are exemplary and explanatory only and are not restrictive of the invention, as claimed.

BRIEF DESCRIPTION OF THE DRAWINGS

FIG. 12b shows the characteristic of the feedback circuit as shown in FIG. 12a;

DESCRIPTION OF THE PREFERRED EMBODIMENTS

The invention provides a low noise output buffer having a design of driver structure including a steady-state driver and a temporary driver. The steady-state driver is coupled to an internal circuit voltage source and the temporary driver is coupled to a buffer voltage source. Each of the steady-state and temporary drivers include a pull-up transistor and a pull-down transistor. The pull-up transistors have sources coupled to high voltage terminals $V_{DD}$ of a voltage source and drains coupled to drains of the pull down transistors. Sources of the pull-down transistors are coupled to low voltage terminal Gnd of the voltage source. A data output terminal is obtained by connecting the drains of the transistors in both drivers. The design of a single steady-state circuit and a predriver to control on/off of gates of the transistors in both drivers results in a large SSN generated in a buffer voltage source and a small SSN in an internal circuit voltages source.

Figure 1:
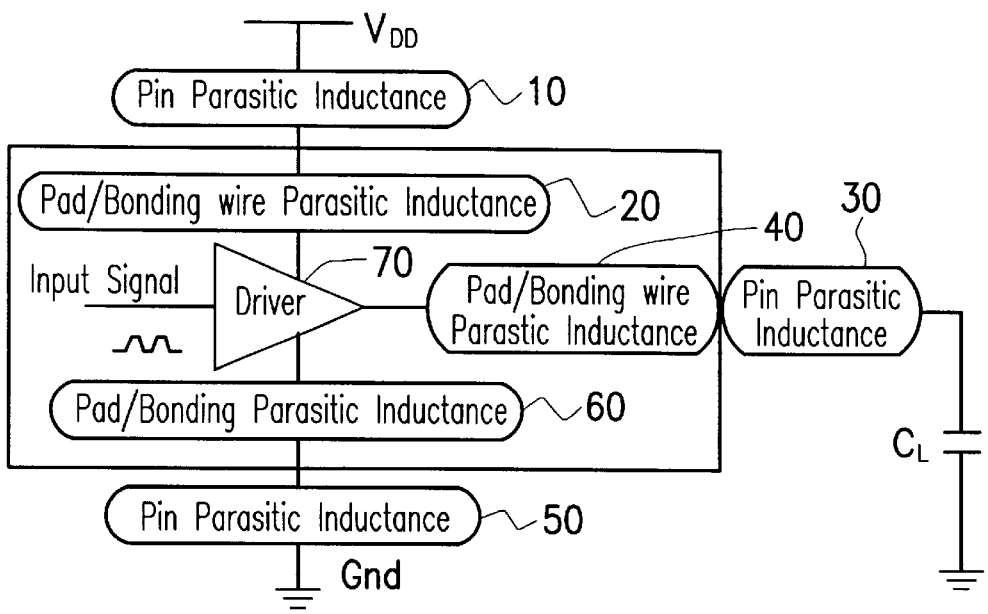
FIG. 1 shows a schematic drawing of a parasitic inductance induced after chip-package.
Figure 2A:
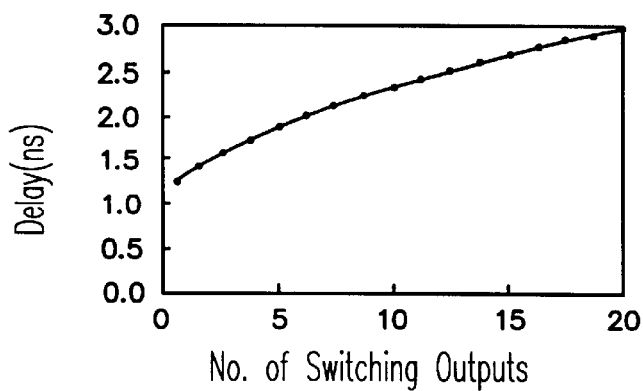
FIG. 2a shows a relationship between a delay time and a number of switching output.
Figure 2B:
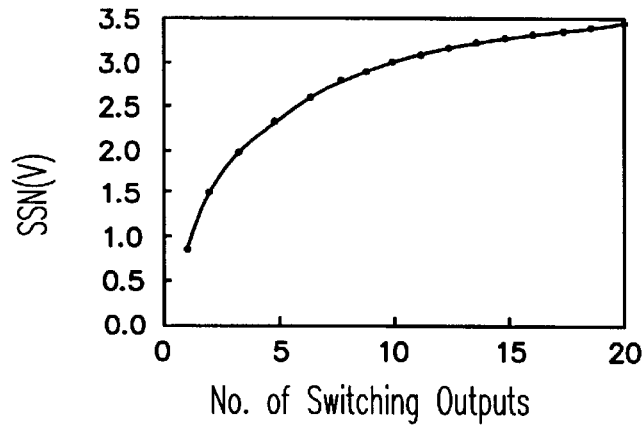
FIG. 2b shows a curve reflecting a relationship between SSN and the number of switching number.
Figure 3:
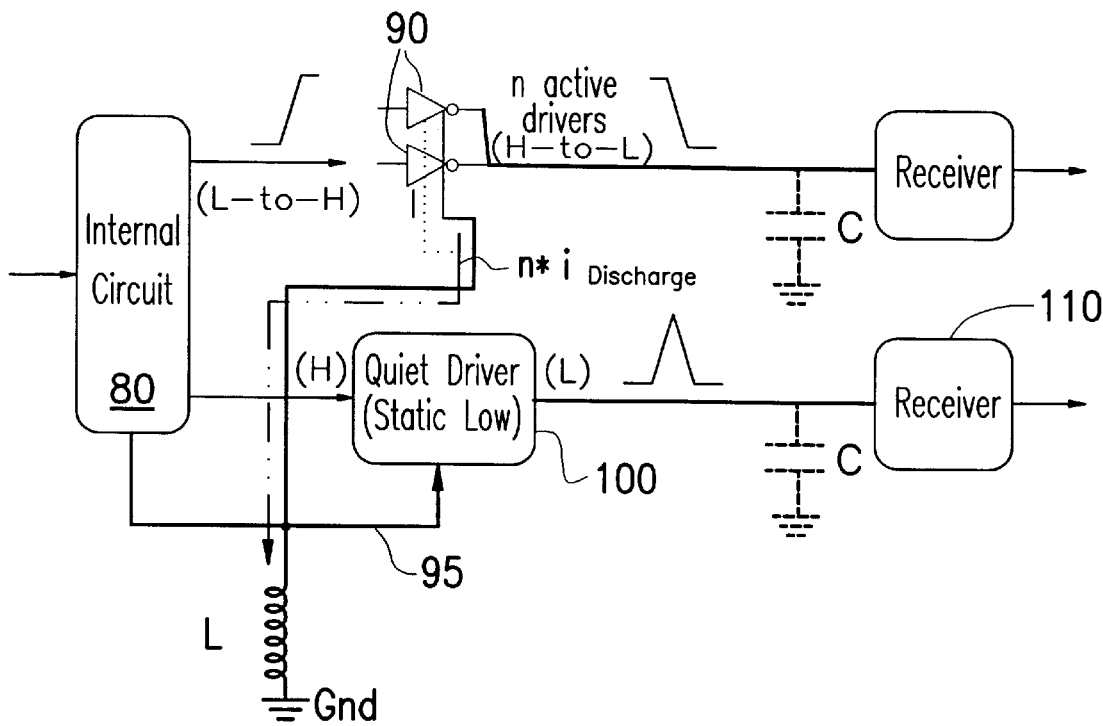
FIG. 3 schematically illustrates interference caused by SSN.
Figure 4:
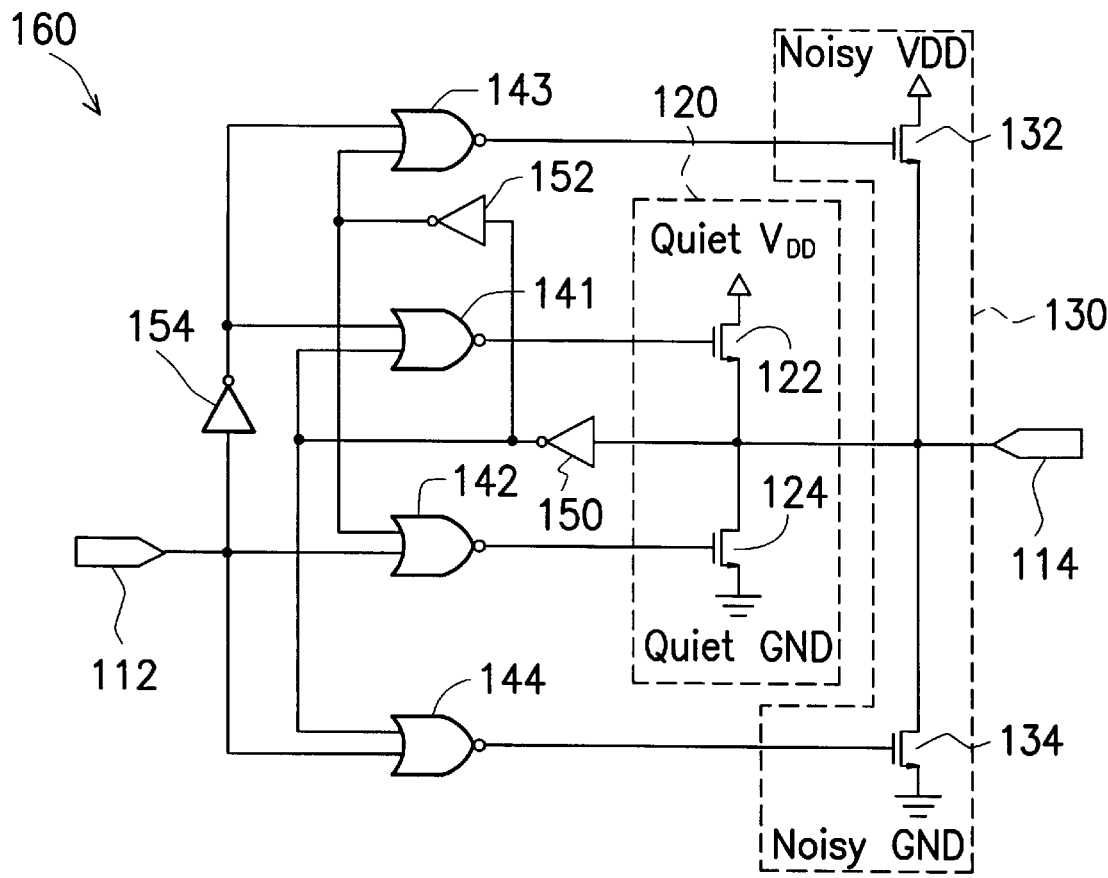
FIG. 4 shows a conventional output buffer with reduced SSN.
Figure 5:
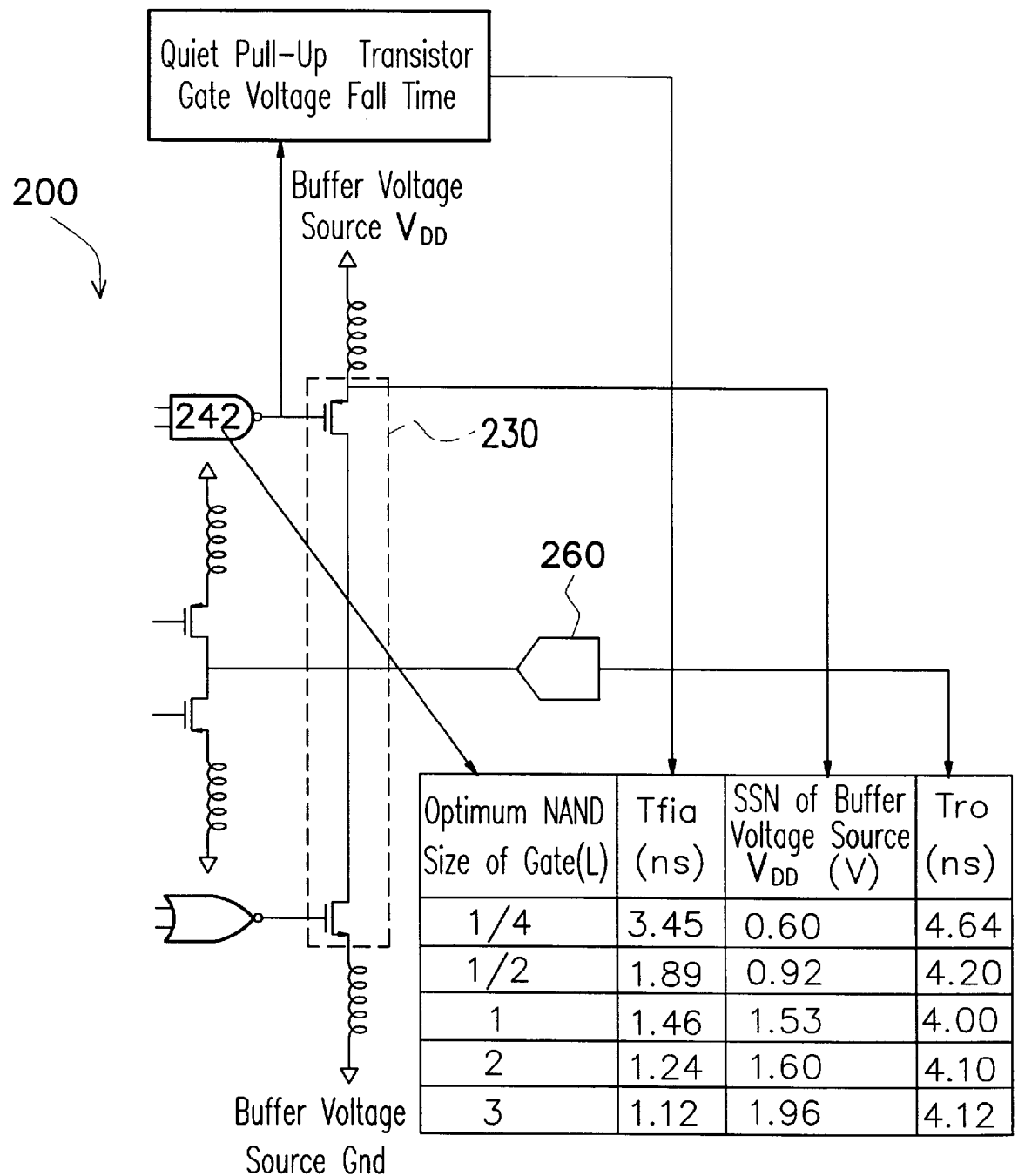
FIG. 5 is a diagram simulating a single steady-state circuit of a pull-up transistor in a temporary driver.

FIG. 5 simulates the single steady-state circuit of gate of the pull-up transistor in the temporary driver. The data presented in the table shown in FIG. 5 show a result of coupling ten output buffers to a single voltage source. Since the SSN of buffer voltage source $V_{DD}$ is not an important concerned issue here, only output delay time (Tro) of the temporary driver 230 is considered. In the table, when an NAND gate has a dimension of 3L, the fall time (Tfia) for gate voltage of the pull-up transistor is about 1.12 ns. Meanwhile, the SSN of the buffer voltage source $V_{DD}$ is about 1.96V and the output delay time (Tro) is about 4.12 ns. From the simulation result, to obtain a shortest output delay time (Tro) of 4.00 ns, the NAND gate 242 has a dimension of about L, the fall time of gate voltage of the pull-up transistor is about 1.46 ns, and the SSN of the buffer voltage source $V_{DD}$ is about 1.53V.

Figure 6:
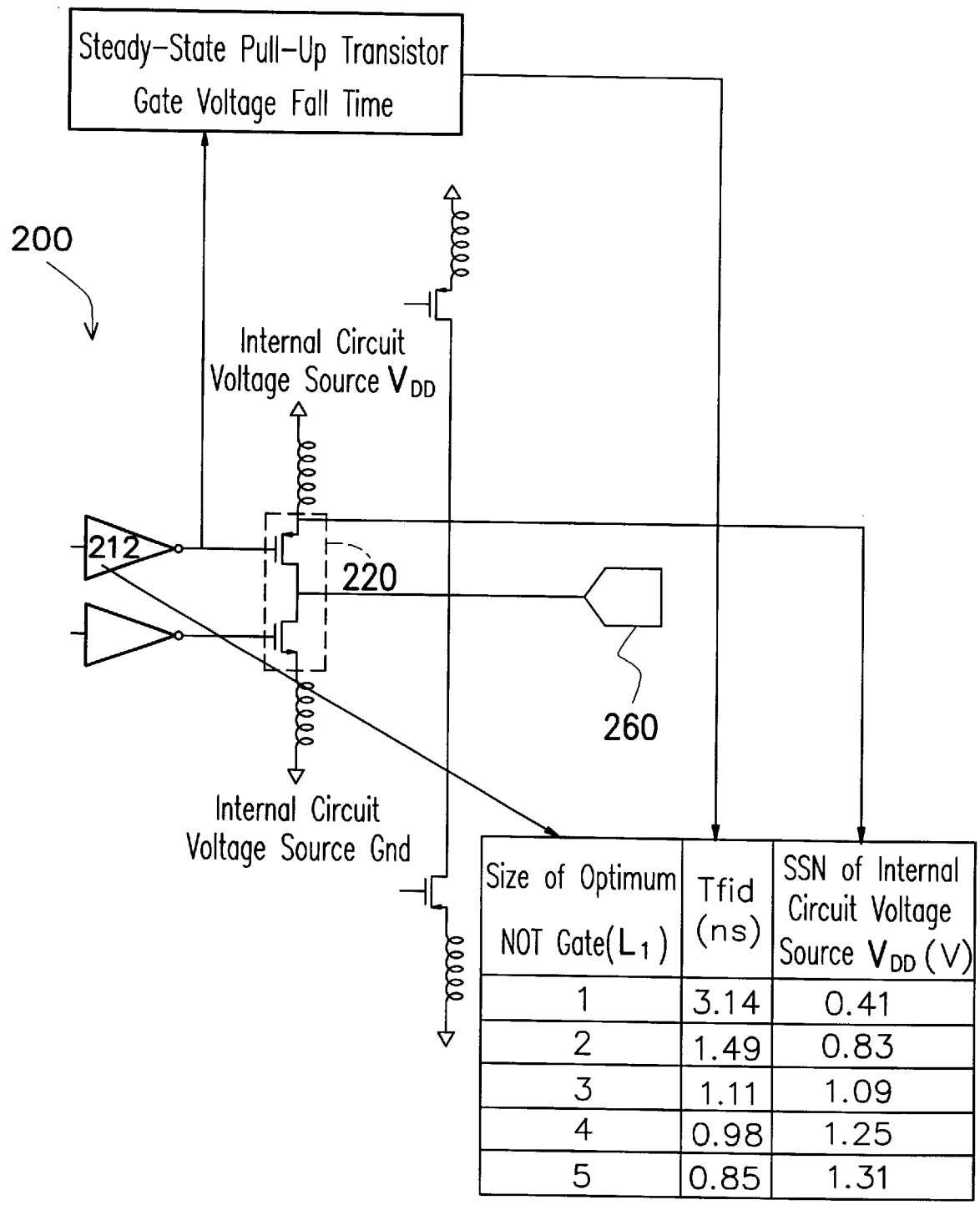
FIG. 6 is a diagram simulating a predriver of a pull-up transistor in a steady-state driver.

FIG. 6 illustrates an operation simulation for predriver of gate of the pull-up transistor of the steady-state driver. The data presented in the table shown in FIG. 5 show a result of coupling ten output buffers to a single voltage source. Since a minimum SSN of the steady-state driver 220 is the major concerned issue, only the SSN is considered of the steady-state driver 220. In the table, when a NOT gate 212 has a dimension of 5L$_1$), the fall time (Tfid) for gate voltage of the pull-up transistor is about 0.85 ns. Meanwhile, the SSN of the internal circuit voltage source $V_{DD}$ is about 1.31V. From the simulation result, to obtain a shortest minimum SSN of 0.41V, the NOT gate 212 has a dimension of about L$_1$, and the fall time (Tfid) of gate voltage of the pull-up transistor is about 3.14 ns.

According to FIG. 5 and FIG. 6, when the data output terminal 260 is switched from L to H, the gate voltage fall time of the pull-up transistor in the temporary driver 230 is shorter than the gate voltage fall time of the pull-up transistor in the steady-state driver 220. Thus, the pull-up transistor in the temporary driver 230 is turned on earlier to generate a large SSN at the buffer voltage source $V_{DD}$. In addition, the pull-up transistor of the steady-state driver 220 is turned on later, a small SSN is thus generated at the internal circuit voltage source $V_{DD}$. On the other hand, when the data output terminal 260 is switched from H to L, the gate voltage fall time of the pull-up transistor in the temporary driver 230 is shorter than the gate voltage fall time of the pull-up transistor in the steady-state driver 220. Thus, the pull-down transistor of the temporary driver 230 is turned on earlier, a large SSN is thus generated at the buffer voltage source Gnd. The pull-up transistor in the steady-state driver 220 is turned on later to generate a small SSN at the internal circuit voltage source Gnd.

Figure 7:
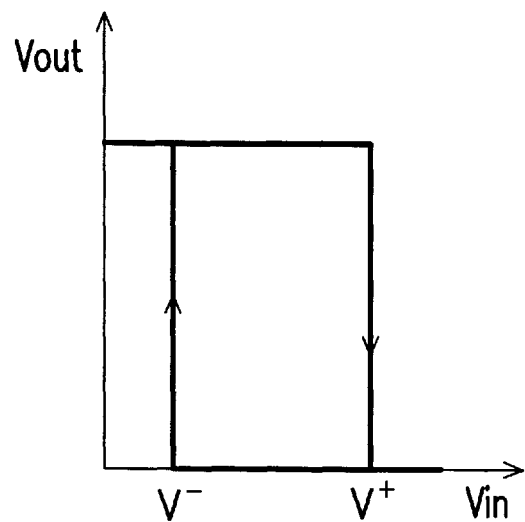
FIG. 7 illustrates a characteristic graph of a Schmitt circuit.

While switching the state, both of the drivers 220 and 230 can be turned on simultaneously to provide a large driving current to speed up the switching operation. However, while the switching operation is complete, a large output signal ringing is generated if both of the drivers 220 and 230 are still on. In the invention, a Schmitt circuit is used to monitor the data output terminal. When the switching operation of the data output terminal is about to be complete, the temporary driver 230 is turned off to reduce the output signal ringing. The characteristic of the Schmitt circuit is as shown in FIG. 7. When an input voltage is larger than $V^+$, the output is low. On the contrary, when the input voltage is smaller than $V^-$, the output is high. Thus, the Schmitt circuit includes two trigger levels.

Figure 8:
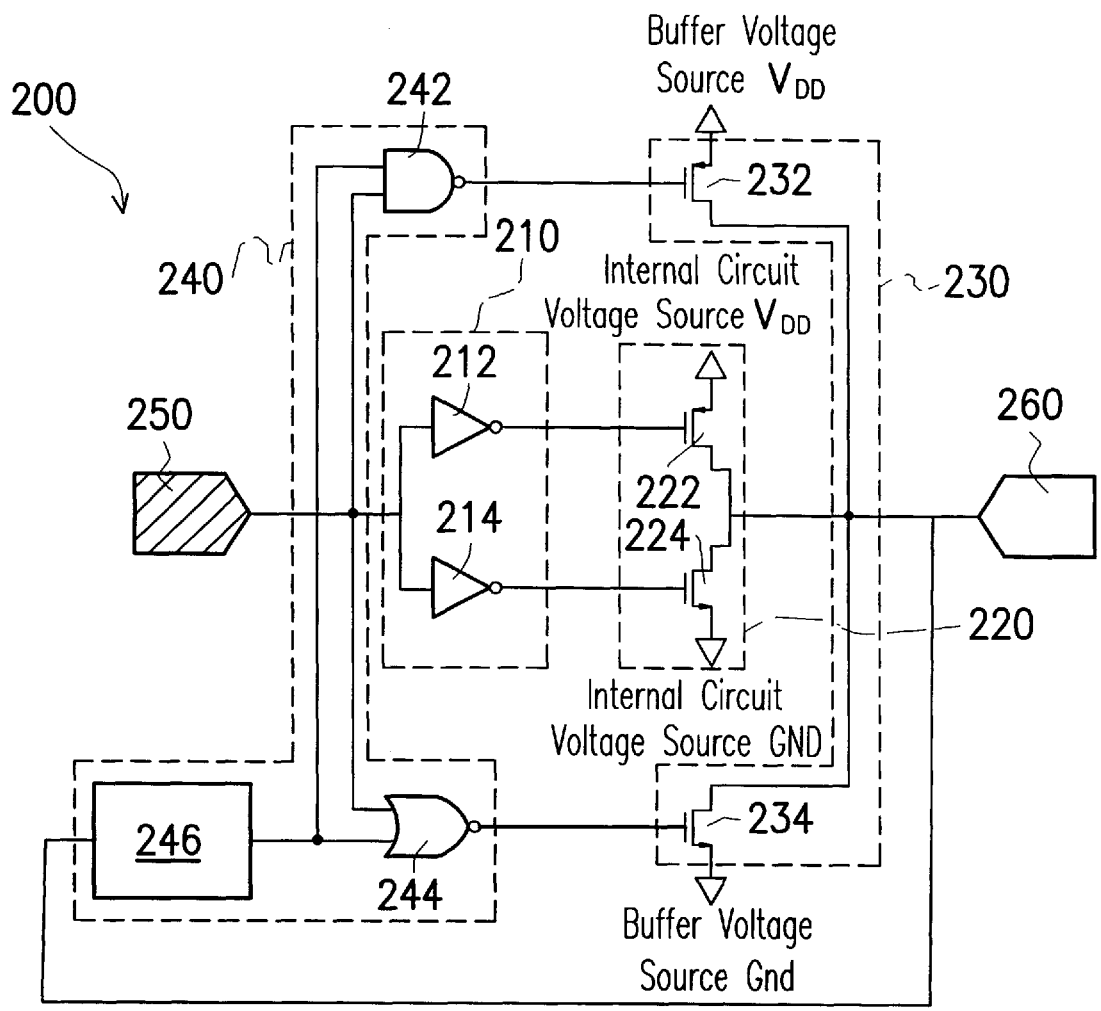
FIG. 8 is a circuit diagram of a low noise output buffer according to an embodiment of the invention.

FIG. 8 shows a circuit diagram of the low noise output buffer according to the invention. A data input terminal 250 and a data output terminal 260 are included. A predriver 210 comprises a first NOT gate 212 and a second NOT gate 214. Input terminals of the first NOT gate 212 and the second NOT gate 214 are coupled to the data input terminal 250. A steady-state driver 220 comprises a steady-state pull-up transistor 222 and a steady-state pull-down transistor 224. The steady-state pull-up transistor 222 has a source coupled to a first high voltage of an internal circuit voltage source (internal circuit voltage source $V_{DD}$) and a drain coupled to a drain of the steady-state pull-down transistor 224. The drain of the steady-state pull-down transistor 224 is further coupled to the data output terminal 260. A source of the steady-state pull-down transistor 224 is coupled to a first low voltage of the internal circuit voltage source (the internal circuit voltage source Gnd). A gate of the steady-state pull-up transistor 222 is coupled to an output terminal of the first NOT gate 212, while a gate of the steady-state pull-down transistor 224 is couple to an output terminal of the second NOT gate 214. A single steady-state means 240 includes a Schmitt circuit 246, a NAND gate 242 and a NOR gate 244. The Schmitt circuit 246 has an input terminal coupled to the data output terminal 260. Input terminals of the NAND gate 242 and the NOR gate 244 are coupled to the data input terminal 250 and the Schmitt circuit 246. A temporary driver 230 comprises a temporary pull-up transistor 232 and a temporary pull-down transistor 234. The temporary pull-up transistor 232 has a source coupled to a second high voltage of a buffer voltage source (buffer voltage source $V_{DD}$) and a drain coupled to a drain of the temporary pull-down transistor 234. The drain of the temporary pull-down transistor 234 is further coupled to the data output terminal 260. A source of the temporary pull-down transistor 234 is coupled to a first low voltage of the buffer voltage source (the buffer voltage source Gnd). A gate of the temporary pull-up transistor 232 is coupled to an output terminal of the NAND gate 242 (a normally high output terminal), while a gate of the temporary pull-down transistor 234 is couple to an output terminal of the second NOR gate 234 (normally low output terminal).

Under a steady state, the data input terminal 250 and the data output terminal 260 are H, the first and the second NOT gates 212 and 214 in the predriver 210 each has an L output. Therefore, the steady-state pull-down transistor 224 is turned off, while the steady-state pull up transistor 222 is turned on to provide the data output terminal 260 to H. The NAND gate 242 and the NOR gate 244 of the single steady-state means 240 provide L to the Schmitt circuit 246 and H to the data input terminal 250. The NAND gate 242 has a H output and the NOR gate 244 has a L output, and the temporary pull-up and pull-down transistor 232 and 234 in the temporary driver 230 are turned off.

When the data input terminal 260 is switched from H to L, the operation comprises two stages:

(1) When the data output terminal 260 is still under the H state, and the data input terminal 250 has been switched into L, the outputs of the first NOT gate 212 and the second NOT gate 214 in the predriver 210 are H. The steady-state pull-up transistor 222 in the steady-state driver 220 is turned off, while the steady-state pull-down transistor 224 is turned off to provide a discharging current path to the data output terminal 260. Meanwhile, the inputs of the NAND gate 242 and the NOR gate 244 of the single steady-state means 240 provides L to the Schmitt circuit 246 and L to the data input terminal 250. The outputs of the NAND gate 242 and the NOR gate 244 are both H, the temporary pull-up transistor 232 in the temporary driver 230 is turned off, while the temporary pull-down transistor 234 thereof is turned on to provide another discharging current path to the data output terminal 260.

By the designed introduced as above, the temporary pull-down transistor 234 in the temporary driver 230 is turned on earlier than the steady-state pull-down transistor 224, so that a majority part of SSN is generated at the buffer voltage source Gnd. Therefore, the SSN generated at the internal circuit voltage source is greatly reduced. The SSN at a power source voltage source Gnd is thus within a tolerable range.

(2) When the data output terminal 260 is switched from H to $V^-$, the output of the Schmitt circuit 246 is H. At this time, the state of the steady-state driver 220 is unchanged, and the steady-state pull-down transistor 224 is remained on. The input terminals of the NAND gate 242 and the NOR gate 244 in the single steady-state means 240 provide H to the Schmitt circuit and L to the data input terminal 250. The output of the NAND gate 242 is H, the output of the NOR gate 244 is L, in the temporary driver 230, the temporary pull-up and pull-down transistor 232 and 234 are both turned off.

Thus, when the data output terminal 260 is about to approach L, the temporary pull-down transistor 234 in the temporary driver 230 is turned off to reduce the output signal ringing while the data output terminal approaches to L.

When both the data input terminal 250 and the data output terminal 260 are L, the outputs of the first and the second NOT gates 212 and 214 in the predriver 210 are H, the steady-state pull-up transistor 222 is turned off, and the steady-state pull-down transistor 224 is turned on to provide L to the data output terminal 260. The inputs of NAND gate 242 and the NOR gate 244 in the single steady-state means

240 provide H to the Schmitt circuit 246 and L to the data input terminal 250. The output of the NAND gate 242 is H, while the output of the NOR gate 244 is L, the temporary pull-up transistor 232 and the temporary pull-down transistor 234 are turned off.

When the data input terminal 260 is switched from L to H, the operation comprises two stages:

(1) When the data output terminal 260 is still under state L, since the data input terminal 250 has been switched into H, the outputs of the first NOT gate 212 and the second NOT gate 214 in the predriver 210 are L. The steady-state pull-down transistor 224 in the steady-state driver 220 is turned off, while the steady-state pull-up transistor 222 is turned on to provide a charging current path to the data output terminal 260. Meanwhile, the inputs of the NAND gate 242 and the NOR gate 244 of the single steady-state means 240 provides H to the Schmitt circuit 246 and H to the data input terminal 250. The outputs of the NAND gate 242 and the NOR gate 244 are both L, the temporary pull-down transistor 234 in the temporary driver 230 is turned off, while the temporary pull-up transistor 232 thereof is turned on to provide another charging current path to the data output terminal 260.

By the designed introduced as above, the temporary pull-up transistor 232 in the temporary driver 230 is turned on earlier than the steady-state pull-up transistor 222, so that a majority part of SSN is generated at the buffer voltage source $V_{DD}$. Therefore, the SSN generated at the internal circuit voltage source $V_{DD}$ is greatly reduced. The SSN at a power source voltage source $V_{DD}$ is thus within a tolerable range.

(2) When the data output terminal 260 is switched from H to $V^+$, the output of the Schmitt circuit 246 is L. At this time, the state of the steady-state driver 220 is unchanged, and the steady-state pull-down transistor 224 is remained on. The input terminals of the NAND gate 242 and the NOR gate 244 in the single steady-state means 240 provide L to the Schmitt circuit and H to the data input terminal 250. The output of the NAND gate 242 is H, the output of the NOR gate 244 is L, in the temporary driver 230, the temporary pull-up and pull-down transistor 232 and 234 are both turned off.

Thus, when the data output terminal 260 is about to approach H, the temporary pull-up transistor 232 in the temporary driver 230 is turned off to reduce the output signal ringing while the data output terminal approaches to L.

Figure 9:
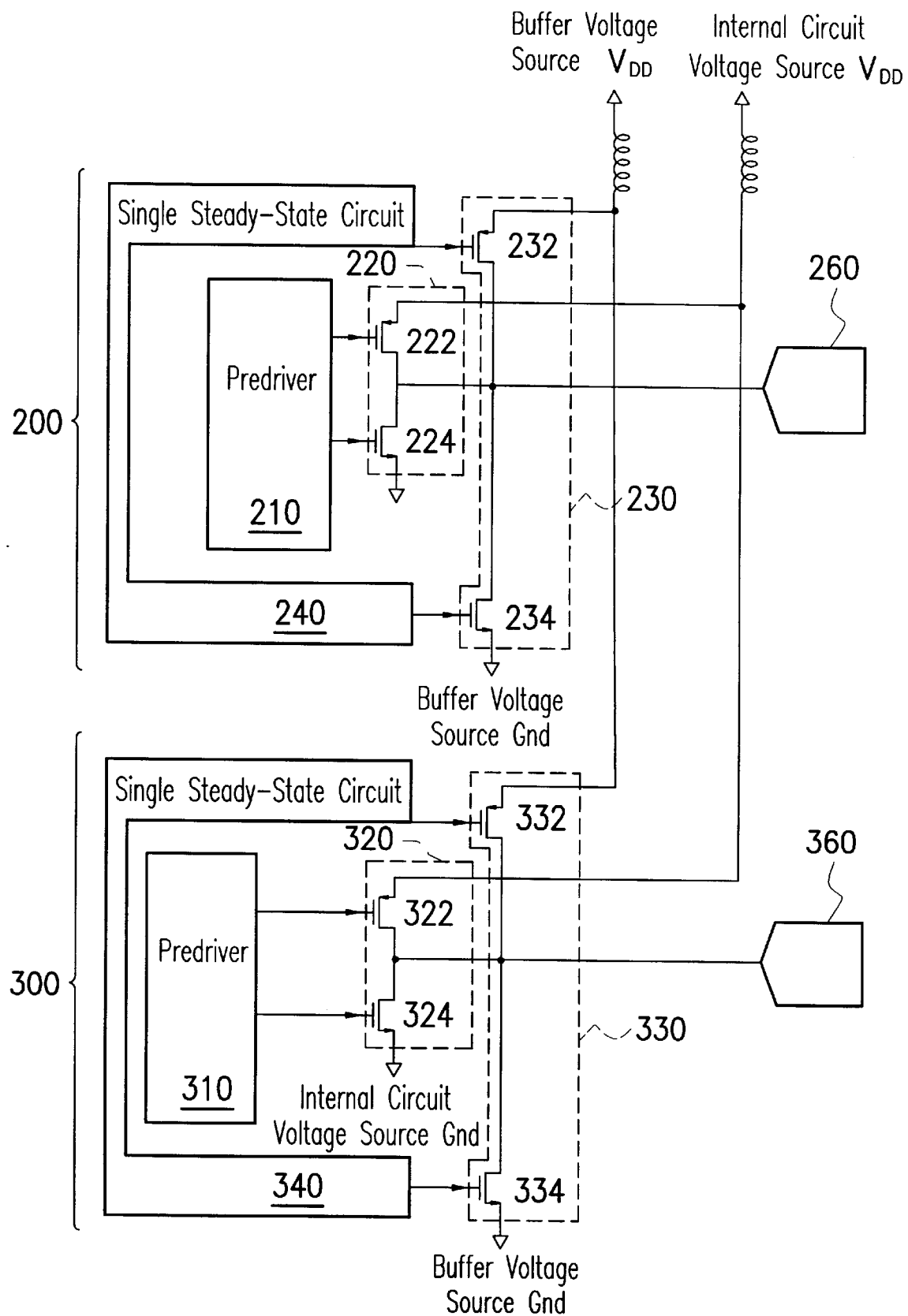
FIG. 9 is a circuit diagram showing a coupling state for two low noise output buffer provides by the invention.

Referring to FIG. 9, a circuit diagram for coupling two low noise output buffers is shown. In FIG. 5, the relationship between the buffer voltage source and the internal circuit voltage source for coupling two low noise output buffers is drawn. The temporary drivers 230 and 330 are respectively coupled to the buffer voltage sources $V_{DD}$/Gnd, while the steady-state drivers are coupled to the internal circuit voltage sources $V_{DD}$/Gnd. Assuming that the data output terminal 260 is L and the data output terminal 360 is H, both the temporary drivers 230 and 330 are turned off.

When the data output terminal 260 of the low noise output buffer 200 is switched from L to H, a large SSN is generated at the internal circuit voltage source $V_{DD}$.

However, since the temporary driver 330 of the low noise output buffer is turned off, the signal of the data output terminal 360 is not to be affected.

The invention thus provides a low noise output buffer which provides a buffer voltage source and uses an internal circuit voltage source to replace another independent voltage source. Thus, the number of independent voltage sources is reduced.

The invention uses a Schmitt circuit to provide two trigger levels to respectively turn off the temporary pull-up and pull-down transistors, so as to speed up operation of the output buffer.

Furthermore, with the design of the predriver and the single steady-state means, the SSN generated at the internal circuit voltage source is much less compared to the SSN generated at the quiet $V_{DD}$/quiet GND voltage source of the output buffer.

Figure 10:
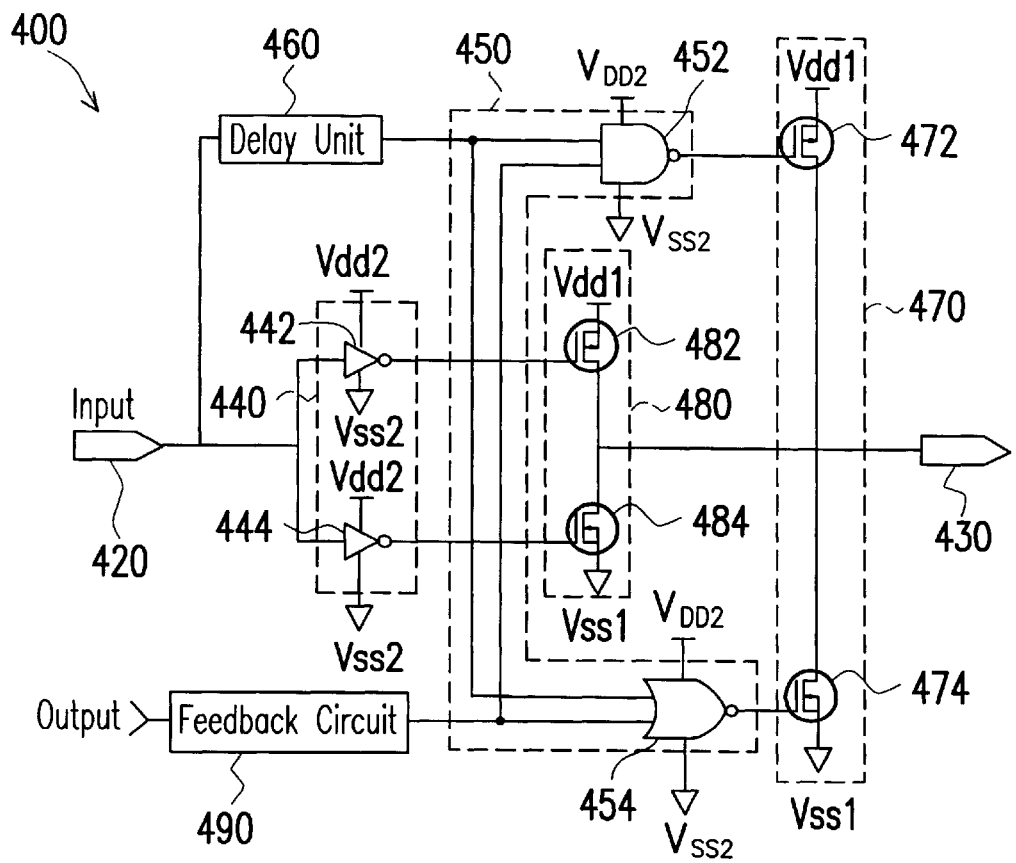
FIG. 10 is a circuit diagram of a low noise output buffer according to another embodiment of the invention.

Referring to FIG. 10, another embodiment of a low noise output buffer is illustrated. In views of functions, the low noise output buffer 400 comprises a temporary driver 470, a steady-state driver 480, a first predriver 440, a second predriver 450, a delay unit 460 and a feedback circuit 490. Two independent voltage sources $V_{DD1}/V_{SS1}$ and $V_{DD2}/V_{SS2}$ are used to operate the low noise output buffer.

The first predriver 440 is operated using the second voltage source $V_{DD2}/V_{SS2}$. The first predriver 440 comprises a first NOT gate 442 and a second NOT gate 444. The first NOT gate 442 includes a first input terminal and a first output terminal, while the second NOT gate 444 includes a second input terminal and a second output terminal. The first input terminal and the second input terminal are coupled to each other at an input node 420.

The steady-state driver 480 is operated by the first voltage source $V_{DD1}/V_{SS1}$.

The steady-state driver 480 includes a steady-state PMOS 482 and a steady-state NMOS 484. The steady-state PMOS 482 has a source coupled to a first high voltage of the first voltage source $V_{DD1}$, and a drain region coupled to a drain of the steady-state NMOS 484 which is further coupled to an output node 430. A source of the steady state NMOS 484 is coupled to a first low voltage $V_{SS1}$, of the first voltage source $V_{DD1}/V_{SS1}$. A gate of the PMOS 482 is coupled to the first output terminal of the first NOT gate 442, while a gate of the NMOS 484 is coupled to the second output terminal of the second NOT gate 444.

The delay unit 460 is operated by the second voltage source $V_{DD2}/V_{SS2}$ and includes a delay input terminal and a delay output terminal. A signal of the input node 420 is delayed with a certain time to be sent to the second predriver 450 by the delay unit 460. The delay input terminal is coupled to the input node 420.

Being supplied by the second voltage source $V_{DD2}/V_{SS2}$, the feedback circuit 490 is used to feed back a state of an output node signal of the output node 430. The feedback circuit 490 includes a feedback input terminal and a feedback output terminal. The feedback input terminal is coupled to the output node 430.

The second predriver 450 is operated by the second voltage source $V_{DD2}/V_{SS2}$ and includes a NAND gate 452 and a NOR gate 454. The NAND gate 452 and the NOR gate 454 each has an input terminal coupled to the delay output terminal of the delay unit 460, and the other input terminal coupled to the feedback output terminal of the feedback circuit 490.

The temporary driver 470 is operated by the first voltage source $V_{DD1}/V_{SS1}$. The temporary driver 470 includes a temporary PMOS 472 and a temporary NMOS 474. A source of the temporary PMOS 472 is coupled to the first high voltage of the first voltage source $V_{DD1}$. A drain of the temporary PMOS 472 is coupled to a drain of the temporary NMOS 474 which is further coupled to the output node 430. A source of the temporary NMOS 474 is coupled to the first low voltage $V_{SS1}$, of the first voltage source $V_{DD1}/V_{SS1}$. The PMOS 472 has a gate coupled to the output terminal of the NAND gate 452, while the NMOS 474 has a gate coupled to the output terminal of the NOR gate 454.

Figure 11:
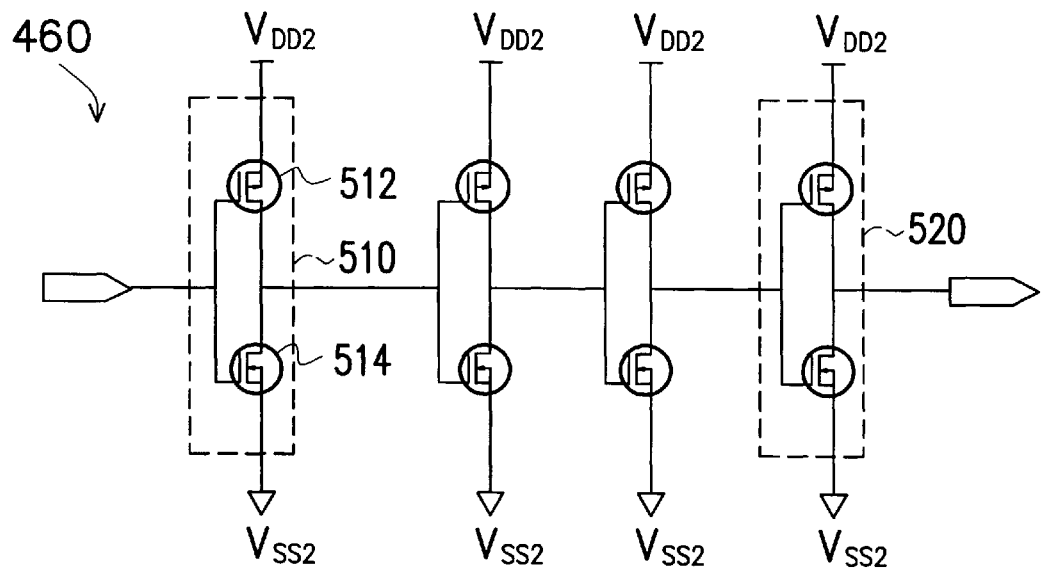
FIG. 11 shows the circuit of the delay unit used in the low noise output buffer shown in FIG. 10.

Referring to FIG. 11, a circuit diagram of the delay unit 460 as shown in FIG. 10 is illustrated. The delay unit 460 includes multiple CMOS circuits connected in series. Each CMOS circuit has an input terminal and an out terminal. An input terminal of a first CMOS circuit 510 is the delay input terminal, while an output terminal of a last CMOS 520 is a delay output terminal of the delay unit 460. Each CMOS circuit has an input terminal coupled to an output terminal of a previous CMOS circuit. The first CMOS circuit 510 comprises a PMOS 512 and a NMOS 514. The PMOS 512 has a source coupled to a second high voltage $V_{DD2}$ of the second voltage source ($V_{DD2}/V_{SS2}$) and a drain coupled to a drain of the NMOS 514. A source of the NMOS 514 is coupled to a second low voltage $V_{SS2}$ of the second voltage source $V_{DD2}/V_{SS2}$. A gate of the PMOS 512 is coupled to a gate of the NMOS 514. The gate of the NMOS 512 is used as an input terminal, while the drain of the NMOS 514 is used as an output terminal of the CMOS circuit 510. The main function for the delay unit 460 is to delay a signal of the input node 420 with a certain time and then turns on the temporary driver 470. For example, the certain time is about 2–3 ns, and an even number of the CMOS circuits is required for the delay unit 460.

Figure 12A:
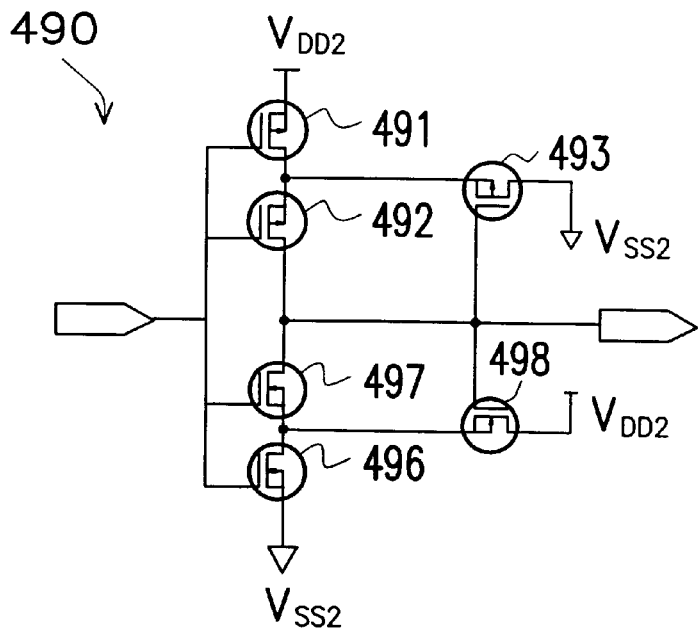
FIG. 12a is a circuit diagram of the feedback circuit used in the low noise output buffer as shown in FIG. 10.

FIG. 12a shows a circuit diagram of the feedback circuit 490 used in the low noise buffer 400 as shown in FIG. 10. The feedback circuit 490 can be a Schmitt trigger circuit including a first PMOS 491, a second PMOS 492, a third PMOS 493, a first NMOS 496, a second NMOS 497 and a third NMOS 498. The feedback input terminal is coupled to gates of the first PMOS 191, the second PMOS 192, the first NMOS 496 and the second NMOS 497. A source of the first PMOS 491 is coupled to a second high voltage $V_{DD2}$ of the second voltage source $V_{DD2}/V_{SS2}$. A drain of the first PMOS 491 is coupled to a source of the second PMOS 492. A drain of the second PMOS 492 is coupled to a drain of the second NMOS 497. A source of the second NMOS 497 is coupled to a drain of the first NMOS 496, and a source of the first NMOS 496 is coupled to the second low voltage $V_{SS2}$ of the second voltage source $V_{DD2}/V_{SS2}$. The third PMOS 493 has a source coupled to both the drain of the first PMOS 491 and the source of the second PMOS 492 and drain of the third PMOS 493 is coupled to the second low voltage $V_{SS2}$. The third NMOS 498 has a drain coupled to the second high voltage $V_{DD2}$ and a source region coupled to both the source of the second NMOS 497 and the drain of the first NMOS 496. A gate of the third PMOS 493 is coupled to a gate of the third NMOS 498. The feedback output terminal is coupled to the gate of the third PMOS 493 and the drain of the second PMOS 492.

Figure 12B:
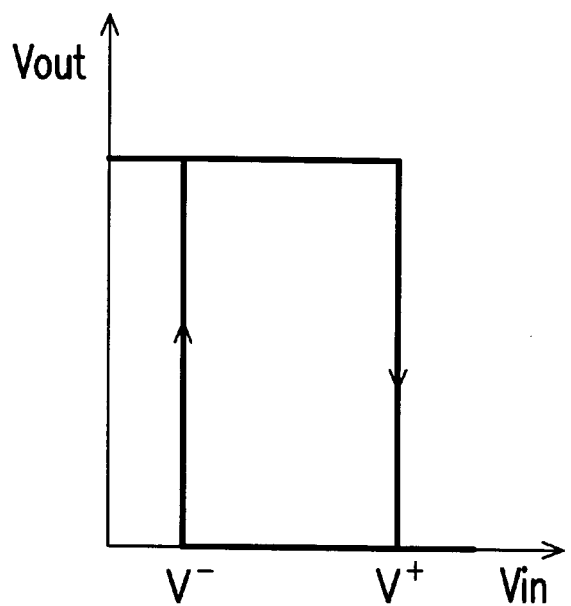

The characteristic of the feedback circuit 490 is shown in FIG. 12b. The Schmitt trigger circuit is a kind of dual steady-state circuit. When a voltage of the feedback input terminal is larger than a voltage of $V^+$, the voltage of the feedback output terminal is switched from a high level (H) to a low level (L). When the voltage of the feedback input terminal is less than a voltage of $V^-$, the feedback output terminal is switched from L to H. With this design, the value of $V^+$ can be determined according to a size ratio between the first NMOS 496 and the third NMOS 498. Similarly, the value of $V^-$ can be determined according to a size ratio between the first PMOS 491 and the third PMOS 493.

When the input node 420 receives a signal of switching from H to L (an H-to-L signal), the first and second NOT gates 442 and 444 output a H signal. Meanwhile, the steady-state PMOS 482 in the steady-state driver 480 is off, while the steady-state NMOS 484 is on to provide a discharging current. The output node 430 is switched from H to L and outputs an H-to-L signal.

With the first predriver 440, the first NOT gate 442 and the second NOT gate 444 can be designed with different turn-on time, so that the steady-state PMOS 482 and the steady-state NMOS 484 of the steady-state driver 480 can not be turned on simultaneously. Therefore, the short-circuit current of the steady-state driver 480 can be greatly reduced to result in a reduced SSN.

At an instant that the input node 420 receives a signal of switching from H to L, and when the output node 430 is still under the H state before being switched, a voltage of the output node 430 is larger than $V^-$. Therefore, the feedback output terminal is H which is output to the input terminals of the NAND gate 452 and the NOR gate 454. When the L signal of the input node 420 is delayed by the delay unit 460 with a certain time to reach the input terminals of the NAND gate 452 and the NOR gate 454, both the NAND gate 452 and the NOR gate output a H signal, so that temporary PMOS 472 is off, and the temporary NMOS 474 is on. That is, after the certain time after the transient period, the temporary NMOS is turned on to provide another path for discharging current, so that the speed of discharging is enhanced.

When the voltage of the output node 430 is switched to lower than $V^-$, the output of the feedback circuit 490 is H. The input terminals of the NAND gate 452 and the NOR gate 454 are L of the delay output terminal and the H the of the feedback output terminal, the NAND gate 452 thus has a H output, while the NOR gate 454 has a L output. Meanwhile, the temporary PMOS 472 is on and the temporary NMOS 474 is off. Thus, during the state is switched from H to L to $V^-$, the temporary driver 470 is off.

Similarly, when the input node 420 receives a L-to-H signal, the first and the second NOT gates 440 and 442 in the first predriver 440 output a L signal. Meanwhile, the steady-state NMOS 484 is turned off, while the steady-state PMOS 482 is turned on to provide a path of charging current. The output node 430 is thus switched from L to H.

At an instant that the input node 420 receives a signal of switching from L to H, and when the output node 430 is still under the L state before being switched, a voltage of the output node 430 is less than $V^+$. Therefore, the feedback output terminal is H which is output to the input terminals of the NAND gate 452 and the NOR gate 454. When the H signal of the input node 420 is delayed by the delay unit 460 with a certain time to reach the input terminals of the NAND gate 452 and the NOR gate 454, both the NAND gate 452 and the NOR gate output a L signal, so that temporary PMOS 472 is on, and the temporary NMOS 474 is off. That is, after the certain time after the transient period, the temporary PMOS is turned on to provide another path for charging current, so that the speed of discharging is enhanced.

When the voltage of the output node 430 is switched to larger than $V^+$, the output of the feedback circuit 490 is H. The input terminals of the NAND gate 452 and the NOR gate 454 are H of the delay output terminal and the L the of the feedback output terminal, the NAND gate 452 thus has a H output, while the NOR gate 454 has a L output. Meanwhile, the temporary PMOS 472 is off and the temporary NMOS 474 is on. Thus, during the state is switched from H to L to $V^+$, the temporary driver 470 is off.

Figure 13:
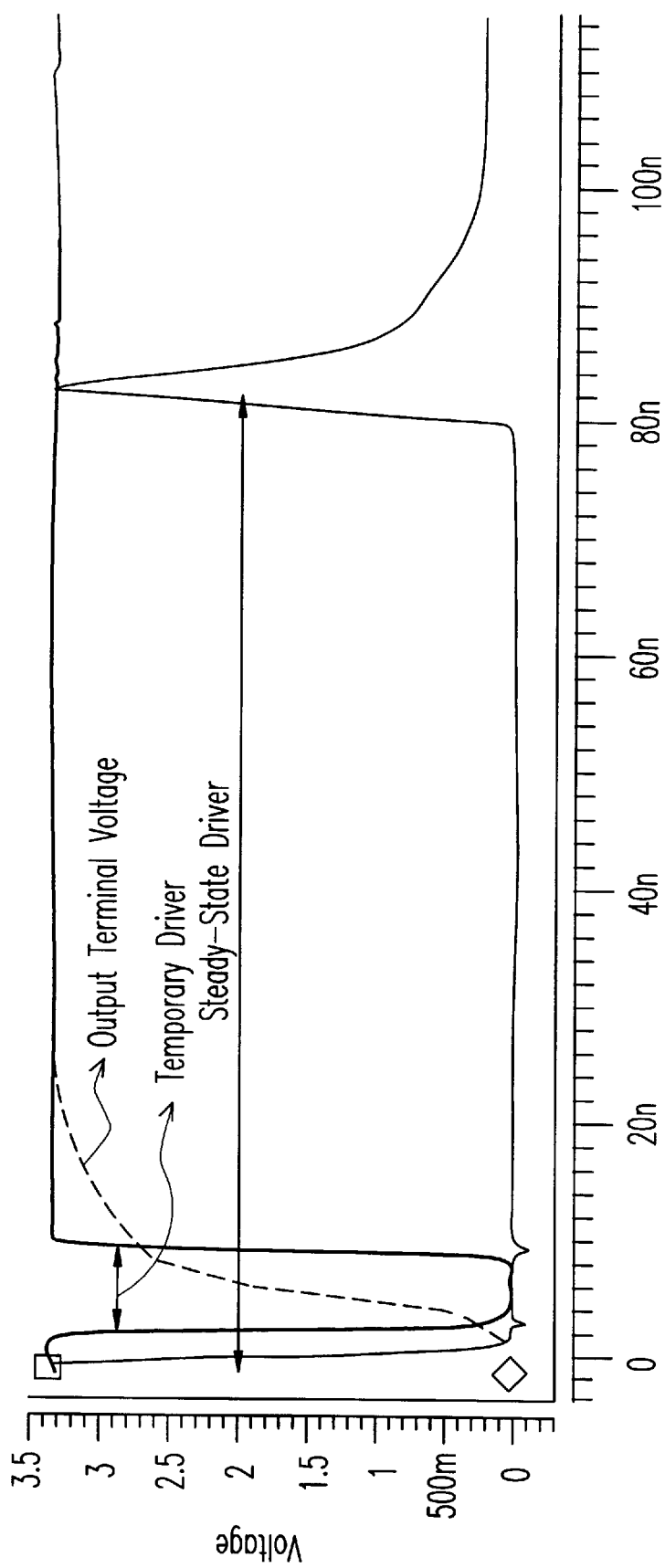
FIG. 13 shows a relationship between the turn-on voltage and the turn-on/off time of the temporary and the steady-state drivers while switching the output terminal from L to H.

Referring to FIG. 13, a turn-on/off time of the temporary and the steady-state drivers while the output node is switched from L to H is illustrated. In FIG. 13, the signals of the temporary driver and the steady-state driver are those of the gates of the temporary PMOS and steady-state PMOS, that is, both of the gates are turned on when the signals are L. As shown in the figure, the temporary driver provides a current charging path only during transient period to speed up the transient, while the steady-state driver remains on until the state is switched.

Figure 14:
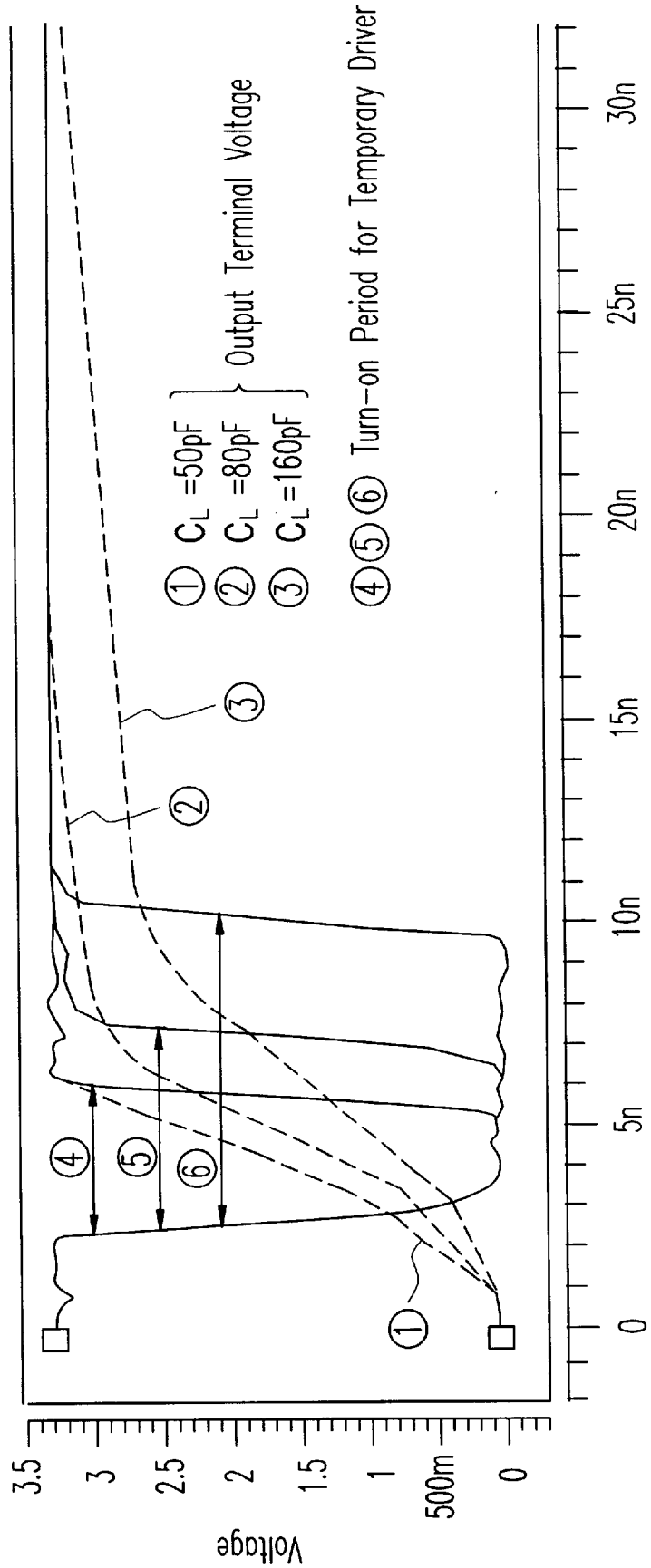
FIG. 14 a relationship between the turned-on/off voltage and the turn-on/off time of the temporary driver under different loading condition.

FIG. 14 shows the turn-on period for the temporary driver when the output buffer is coupled to different loading. Due to the characteristic of the feedback circuit, different turn-on periods are obtained under different loading. The curve ① illustrates the voltage of the output node when the loading is 50 pF and the turn-on period for the temporary driver is shown as the curve ④. The curve ② illustrates the voltage of output node when the loading is 80 pF, and the turn-on period of the temporary driver is shown as the curve ⑤. The curve ③ shows the voltage of the output node under a loading of 160 pF, and the curve ⑥ shows the turn-on period of the temporary driver.

Since the temporary driver is turned off at the beginning and end of the transient period, so that the ground bounces and the output signal ringing can be greatly reduced. Furthermore, the SSN can also be reduced, so that a high speed operation of the drivers can be performed.

In this embodiment of the invention, the design of different connection for gates of the steady-state driver prohibits the PMOS and the NMOS to be turned on or turned off simultaneously. Therefore, the short circuit current is eliminated to result in a reduced SSN.

Moreover, the turn-off time of the temporary driver can be altered due to different loading of the feedback circuit, the capability of current driving can be enhanced and thus is advantageous to the high speed operation.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A low noise output buffer coupled to a buffer voltage source and an internal circuit voltage source, comprising:

a data input terminal;

a data output terminal;

a predriver, comprising a first NOT gate and a second NOT gate, the first NOT gate having a first input terminal and a first output terminal, while the second NOT gate having a second input terminal and a second output terminal, the first input terminal and the second input terminal being coupled to the data input terminal;

a steady-state driver, comprising a steady-state pull-up transistor and a steady-state pull-down transistor, the steady-state pull-up transistor comprising a steady-state pull-up transistor source, a steady-state pull-up transistor drain and a steady-state pull-up transistor gate, while the steady-state pull-down transistor comprising a steady-state pull-down transistor source, a steady-state pull-down transistor drain and a steady-state pull-down transistor gate, the steady-state pull-up transistor source being coupled to a first high voltage of the internal circuit voltage source, the steady-state pull-up transistor drain being coupled to the steady-state pull-down drain which is further coupled to the data output terminal, the steady-state pull-down source being coupled to a first low voltage of the internal circuit voltage source, and the steady-state pull-up transistor gate being coupled to the first output terminal, the steady-state pull-down transistor gate being coupled to the second output terminal;

a single steady-state means, comprising a Schmitt circuit, a NAND gate and a NOR gate, the Schmitt circuit comprising a Schmitt input terminal and a Schmitt output terminal, the Schmitt input terminal being coupled to the data output terminal to feed back a signal thereof, the NAND gate having two NAND gate input terminals and one NAND gate output terminal, the NOR gate having two NOR gate input terminals and one NOR gate output terminal, one of the NOR gate input terminals being coupled to the data input terminal, while the other of the NOR gate input terminals being coupled to the Schmitt output terminal, one of the NAND gate input terminals being coupled to the data input terminal, while the other of the NAND gate input terminals being coupled to the Schmitt output terminal; and a temporary driver, comprising a temporary pull-up transistor and a temporary pull-down transistor, the temporary pull-up transistor comprising a temporary pull-up transistor source, a temporary pull-up transistor drain and a temporary pull-up transistor gate, while the temporary pull-down transistor comprising a temporary pull-down transistor source, a temporary pull-down transistor drain and a temporary pull-down transistor gate, the temporary pull-up transistor source being coupled to a second high voltage of the buffer voltage source, the temporary pull-up transistor drain being coupled to the temporary pull-down drain which is further coupled to the data output terminal, the temporary pull-down source being coupled to a second low voltage of the buffer voltage source, and the temporary pull-up transistor gate being coupled to the NAND gate output terminal, the temporary pull-down transistor gate being coupled to the NOR output terminal.

2. The low noise output buffer according to claim 1, wherein the first NOT gate is turned on with a longer time compared to the NAND gate.

3. The low noise output buffer according to claim 1, wherein the second NOT gate is turned on with a longer time compared to the NOR gate.

4. The low noise output buffer according to claim 1, wherein the Schmitt circuit includes a dual steady-state circuit of which the Schmitt output terminal is switched from a high level to a low level when the Schmitt input terminal is larger than a voltage $V^+$, while the Schmitt output terminal is switched from a low level to a high level when the Schmitt input terminal is smaller than a voltage $V^-$.

5. A low noise output buffer, coupled to an internal circuit voltage source and a buffer voltage source, the low noise output buffer comprising:
   a data input terminal;
   a data output terminal;
   a predriver, coupled to the data input terminal to switch and output a signal of the data input terminal;
   a steady-state driver, operating with a supply of the internal circuit voltage source, the steady-state driver being coupled to the predriver to switch a signal thereof into a same state of the signal of the data input terminal, so as to output the switched signal into the data output terminal;
   a single steady-state means, comprising a normally high output terminal and normally low output terminal, the single steady-state means being coupled to the data input terminal the data output terminal, so as to generate either a transient low level at the normally high output terminal or a transient high level at the normally low output terminal according to the signals of the data input and output terminals; and
   a temporary driver, using the buffer voltage source to operate, the temporary driver being coupled to the normally high output terminal and the normally low output terminal, and the temporary driver is selectively turned on or off according to the normally high and low output terminals;
   wherein the single steady-state means further comprises a Schmitt circuit, a NAND gate and a NOR gate, the Schmitt circuit comprising a Schmitt input terminal and a Schmitt output terminal, the Schmitt input terminal being coupled to the data output terminal to feed back a signal thereof, the NAND gate having two NAND gate input terminals and one NAND gate output terminal, the NOR gate having two NOR gate input terminals and one NOR gate output terminal, one of the NOR gate input terminals being coupled to the data input terminal, while the other of the NOR gate input terminals being coupled to the Schmitt output terminal, one of the NAND gate input terminals being coupled to the data input terminal, while the other of the NAND gate input terminals being coupled to the Schmitt output terminal.

6. The low noise output buffer according to claim 5, wherein the the Schmitt circuit includes a dual steady-state circuit of which the Schmitt output terminal is switched from a high level to a low level when the Schmitt input terminal is larger than a voltage $V^+$, while the Schmitt output terminal is switched from a low level to a high level when the Schmitt input terminal is smaller than a voltage $V^-$.

7. The low noise output buffer according to claim 5, wherein the first NOT gate is turned on with a longer time compared to the NAND gate.

8. The low noise output buffer according to claim 5, wherein the second NOT gate is turned on with a longer time compared to the NOR gate.

9. A low noise output buffer, coupled to a first voltage source and a second voltage source, the low noise output buffer comprising:
   an input node;
   an output node;
   a first predriver, operated by the second voltage source and including a first NOT gate and a second NOT gate, wherein the first NOT gate comprises a first input terminal and a first output terminal, while the second NOT gate comprises a second input terminal and a second output terminal, the first input terminal and the second input terminal are coupled to the input node;
   a steady-state driver, including a steady-state PMOS and a steady-state NMOS, the steady-state PMOS comprising a steady-state PMOS source, a steady-state PMOS drain and a steady-state PMOS gate, while the steady-state NMOS comprising a steady-state NMOS source, a steady-state NMOS drain and a steady-state NMOS gate, wherein the steady-state PMOS source is coupled to a first high voltage of the first voltage source, the steady-state PMOS drain is coupled to the steady-state NMOS drain which is further coupled to the output node, the steady-state NMOS source is coupled to a first low voltage of the first voltage source, the steady-state PMOS gate is coupled to the first output terminal, and the steady-state NMOS gate is coupled to the second output terminal;
   a delay unit, operated by the second voltage source to delay a signal of the input node with a certain time, the delay unit comprising a delay input terminal and a delay output terminal, wherein the delay input terminal is coupled to the input node;
   a feedback circuit, operated by the second voltage source and comprising a feedback input terminal and a feedback output terminal, the feedback input terminal is coupled to the output node to feed back a signal of the output node;
   a second predriver, operated by the second voltage source and comprising a NAND gate and a NOR gate; the NAND gate including two NAND gate input terminals and a NAND gate output terminal, while the NOR gate including two NOR gate input terminals and a NOR gate output terminal, wherein one of the NAND gate input terminals is coupled to the delay output terminal and the other NAND gate input terminal is coupled to the feedback output terminal, while one of the NOR gate input terminals is coupled to the delay output terminal and the other NOR gate input terminal is coupled to the feedback output terminal; and
   a temporary driver, comprising a temporary PMOS and temporary NMOS, the temporary PMOS including a temporary PMOS source, a temporary PMOS drain and a temporary PMOS gate, and the temporary NMOS including a temporary NMOS source, a temporary NMOS drain and a temporary NMOS gate, wherein the temporary PMOS source is coupled to the first high voltage of the first voltage source, the temporary PMOS drain is coupled to the temporary NMOS drain which is further coupled to the output node, the temporary NMOS source is coupled to the first low voltage of the first voltage source, the temporary PMOS gate is coupled to the NAND gate output terminal, ad the temporary NMOS gate is coupled to the NOR gate output terminal.

10. The low noise output buffer according to claim 9, wherein the first predriver is designed to have the first NOT gate having a turn-on time different from a turn-on time of the second NOT gate to reduce a short circuit current of the steady-state driver.

11. The low noise output buffer according to claim 9, wherein the delay unit comprises a plurality of CMOS circuits connected in series, each of the CMOS circuits includes a CMOS input terminal and a CMOS out terminal, the CMOS input terminal of the first CMOS circuit is coupled to the delay output terminal, each CMOS input terminal is coupled to a previous CMOS output terminal, and each CMOS output terminal is coupled to a following CMOS input terminal.

12. The low noise output buffer according to claim 11, wherein each CMOS circuit comprises a PMOS and a NMOS, a source of the PMOS is coupled to a second high voltage in the second voltage source, a drain of the PMOS is coupled to a drain of the NMOS, a source of the NMOS is coupled to a second low voltage in the second voltage source, and a gate of the PMOS is coupled to a gate of the NMOS, and the drain of the PMOS is the CMOS input terminal.

13. The low noise output buffer according to claim 11, wherein the certain time delayed by the delay unit is determined according to a number of the CMOS circuits.

14. The low noise output buffer according to claim 9, wherein the delay unit comprises an even number of CMOS circuits connected in series.

15. The low noise output buffer according to claim 9, wherein the feedback circuit comprises a Schmitt trigger circuit including a first PMOS, a second PMOS, a third PMOS, a first NMOS, a second NMOS and a third NMOS, the feedback input terminal is coupled to a gate of the first PMOS, a source of the first PMOS is coupled to the second high voltage of the second voltage source, a drain of the first PMOS is coupled to a source of the second PMOS, a drain of the second PMOS is coupled to a drain of the second NMOS, a source of the second NMOS is coupled to a drain of the first NMOS, a source of the first NMOS is coupled to the second low voltage of the second voltage source, a drain of the third PMOS is coupled to the second low voltage of the second voltage source, a source of the third PMOS is coupled to the source of the second PMOS, a drain of the third NMOS is coupled to the second high voltage of the second voltage source, a source of the third NMOS is coupled to the source of the second NMOS, and a gate of the third PMOS is coupled to a gate of the third NMOS.

16. The low noise output buffer according to claim 15, wherein the Schmitt circuit includes a dual steady-state circuit, in which when a voltage of the feedback input terminal is larger than a voltage $V^+$, the feedback output terminal is switched from a high voltage level to a low voltage level, and when the voltage the feedback input terminal is smaller than a voltage $V^-$, the feedback output terminal is switched from the low voltage level to the high voltage level.

17. The low noise output buffer according to claim 16, wherein a value of the voltage $V^+$ can be determined by a size ratio between the first NMOS and the third NMOS.

18. The low noise output buffer according to claim 16, wherein a value of the voltage $V^-$ can be determined by a size ratio between the first PMOS and the third PMOS.

19. A low noise output buffer coupled to a first voltage source and a second voltage source, the low noise output buffer comprises:

an input terminal;

an output terminal;

a first predriver, operated by the second voltage source and coupled to the input node to switch and output a signal of the input terminal;

a steady-state driver, operated by the first voltage source and coupled to the first predriver, so as to switch a signal of the first predriver into a signal having a same state of a signal of the output terminal;

a delay unit, operated by the delay unit and coupled to the input node to delay the signal of the input node with a certain time, and then output the signal of the input node;

a feedback circuit, operated by the second voltage source and coupled to the output node to feedback the state of the signal of the output node;

a second predriver, operated by the second voltage source and coupled to the feedback circuit and the delay unit, so as to generate an output; and a temporary driver, operated by the first voltage source and coupled to the second predriver to be turned or off according to the output of the second predriver.

20. The low noise output buffer according to claim 19, wherein the first predriver comprises a first NOT gate and a second NOT gate, the first NOT gate includes a first input terminal and a first output terminal, and the second NOT gate includes a second input terminal and a second output terminal, the first input terminal and the second input terminal are coupled to the input node.

21. The low noise output buffer according to claim 20, wherein the first predriver is designed to have the first NOT gate having a turn-on time different from a turn-on time of the second NOT gate to reduce a short circuit current of the steady-state driver.

22. The low noise output buffer according to claim 19, wherein the steady-state driver comprises a steady-state PMOS and a steady-state NMOS, the steady-state PMOS comprising a steady-state PMOS source, a steady-state PMOS drain and a steady-state PMOS gate, while the steady-state NMOS comprising a steady-state NMOS source, a steady-state NMOS drain and a steady-state NMOS gate, the steady-state PMOS source is coupled to a first high voltage of the first voltage source, the steady-state PMOS drain is coupled to the steady-state NMOS drain which is further coupled to the output node, the steady-state NMOS source is coupled to a first low voltage of the first voltage source, the steady-state PMOS gate is coupled to the first output terminal, and the steady-state NMOS gate is coupled to the second output terminal.

23. The low noise output buffer according to claim 19, wherein the delay unit comprises a plurality of CMOS circuits connected in series, each of the CMOS circuits includes a CMOS input terminal and a CMOS out terminal, the CMOS input terminal of the first CMOS circuit is coupled to the delay output terminal, each CMOS input terminal is coupled to a previous CMOS output terminal, and each CMOS output terminal is coupled to a following CMOS input terminal.

24. The low noise output buffer according to claim 23, wherein each CMOS circuit comprises a PMOS and a NMOS, a source of the PMOS is coupled to a second high voltage in the second voltage source, a drain of the PMOS is coupled to a drain of the NMOS, a source of the NMOS is coupled to a second low voltage in the second voltage source, and a gate of the PMOS is coupled to a gate of the NMOS, and the drain of the PMOS is the CMOS input terminal.

25. The low noise output buffer according to claim 19, wherein the certain time delayed by the delay unit is determined according to a number of the CMOS circuits.

26. The low noise output buffer according to claim 19, wherein the delay unit comprises an even number of CMOS circuits connected in series.

27. The low noise output buffer according to claim 19, wherein the feedback circuit comprises a Schmitt trigger circuit including a first PMOS, a second PMOS, a third PMOS, a first NMOS, a second NMOS and a third NMOS, the feedback input terminal is coupled to a gate of the first PMOS, a source of the first PMOS is coupled to the second high voltage of the second voltage source, a drain of the first PMOS is coupled to a source of the second PMOS, a drain of the second PMOS is coupled to a drain of the second NMOS, a source of the second NMOS is coupled to a drain of the first NMOS, a source of the first NMOS is coupled to the second low voltage of the second voltage source, a drain of the third PMOS is coupled to the second low voltage of the second voltage source, a source of the third PMOS is coupled to the source of the second PMOS, a drain of the third NMOS is coupled to the second high voltage of the second voltage source, a source of the third NMOS is coupled to the source of the second NMOS, and a gate of the third PMOS is coupled to a gate of the third NMOS.

28. The low noise output buffer according to claim 27, wherein the Schmitt circuit includes a dual steady-state circuit, in which when a voltage of the feedback input terminal is larger than a voltage $V^+$, the feedback output terminal is switched from a high voltage level to a low voltage level, and when the voltage the feedback input terminal is smaller than a voltage $V^-$, the feedback output terminal is switched from the low voltage level to the high voltage level.

29. The low noise output buffer according to claim 28, wherein a value of the voltage $V^+$ can be determined by a size ratio between the first NMOS and the third NMOS.

30. The low noise output buffer according to claim 28, wherein a value of the voltage $V^-$ can be determined by a size ratio between the first PMOS and the third PMOS.

31. The low noise output buffer according to claim 19, wherein the second predriver comprises a NAND gate and a NOR gate, the NAND gate includes two NAND gate input terminals and a NAND gate output terminal, while the NOR gate includes two NOR gate input terminals and a NOR gate output terminal, one of the NAND gate input terminals is coupled to the delay output terminal and the other NAND gate input terminal is coupled to the feedback output terminal, while one of the NOR gate input terminals is coupled to the delay output terminal and the other NOR gate input terminal is coupled to the feedback output terminal.

32. The low noise output buffer according to claim 19, wherein the temporary driver comprises a temporary PMOS and temporary NMOS, the temporary PMOS includes a temporary PMOS source, a temporary PMOS drain and a temporary PMOS gate, and the temporary NMOS includes a temporary NMOS source, a temporary NMOS drain and a temporary NMOS gate, the temporary PMOS source is coupled to the first high voltage of the first voltage source, the temporary PMOS drain is coupled to the temporary NMOS drain which is further coupled to the output node, the temporary NMOS source is coupled to the first low voltage of the first voltage source, the temporary PMOS gate is coupled to the NAND gate output terminal, and the temporary NMOS gate is coupled to the NOR gate output terminal.

* * * * *